(12) United States Patent
Nagahama (10) Patent No.: US 10,599,198 B2
(45) Date of Patent: Mar. 24, 2020

(54) LOAD DRIVING DEVICE

(71) Applicant: Sumitomo Wiring Systems, Ltd., Yokkaichi, Mie (JP)

(72) Inventor: Takahiro Nagahama, Mie (JP)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 332 days.

(21) Appl. No.: 15/596,912

(22) Filed: May 16, 2017

(65) Prior Publication Data
US 2017/0329378 A1  Nov. 16, 2017

(30) Foreign Application Priority Data

May 16, 2016  (JP) ................ 2016-097620

(51) Int. Cl.
| | |
|---|---|
| *G06F 1/28* | (2006.01) |
| *H02J 7/00* | (2006.01) |
| *H03K 17/30* | (2006.01) |
| *G06F 1/30* | (2006.01) |
| *H01H 9/54* | (2006.01) |
| *H01L 27/02* | (2006.01) |
| *H02J 9/06* | (2006.01) |
| *H03K 17/16* | (2006.01) |

(52) U.S. Cl.
CPC ............. *G06F 1/28* (2013.01); *G06F 1/30* (2013.01); *H01H 9/541* (2013.01); *H01L 27/0248* (2013.01); *H02J 7/0065* (2013.01); *H02J 9/061* (2013.01); *H03K 17/162* (2013.01); *H03K 17/302* (2013.01)

(58) Field of Classification Search
CPC .............. G06F 1/28; G06F 1/30; H01H 9/541
See application file for complete search history.

(56) References Cited

U.S. PATENT DOCUMENTS 4,511,829 A * 4/1985 Wisniewski ......... H01H 47/325
361/154

FOREIGN PATENT DOCUMENTS

JP  2007-295758 A  11/2007

* cited by examiner

*Primary Examiner* — Scott Bauer
(74) *Attorney, Agent, or Firm* — Honigman LLP (57) ABSTRACT

A load driving device is configured to reduce erroneous blocking operation in a switch. The load driving device includes: a control unit configured to output a driving signal and a non-driving signal; a first switch unit configured to switch power between a power supply unit and a load to a conductive state and a non-conductive state, and switch the power path to a conductive state when a difference between a potential of the first input line and a potential of a conducting path on the load side is greater than a predetermined value; and a second switch unit configured to connect a power supply to the first input line into a conductive state upon the control unit outputting the driving signal, and to block conduction between the power supply path and the first input line upon the control unit outputting the non-driving signal.

5 Claims, 5 Drawing Sheets

LOAD DRIVING DEVICE

CROSS-REFERENCE TO RELATED APPLICATIONS

This application claims priority to Japanese Patent Application No. 2016-097620, filed May 16, 2016.

TECHNICAL FIELD

The present invention relates to a load driving device.

BACKGROUND ART

JP 2007-295758A discloses a surge protection device for protecting a semiconductor element that is connected to a power supply to operate, from a negative surge current. This surge protection device includes a reverse current prevention diode that prevents a current from flowing backward to a semiconductor element, and a voltage limiting circuit that limits a reverse voltage that is applied to the semiconductor element, to be no greater than the withstand voltage of the semiconductor element. The surge protection device has a configuration in which, if a negative surge current intrudes into the power supply while the semiconductor element is being supplied with power from the power supply, the direction in which the voltage is applied to the reverse current prevention diode is switched from a forward direction to a reverse direction.

If power supply to a load is controlled by switching between switching elements, there is the risk of erroneous blocking occurring in a switching element due to a potential rise that is caused by a current that is applied to the load. The following describes this problem with reference to the simplified diagram shown in FIG. 4, for example.

Figure 4:
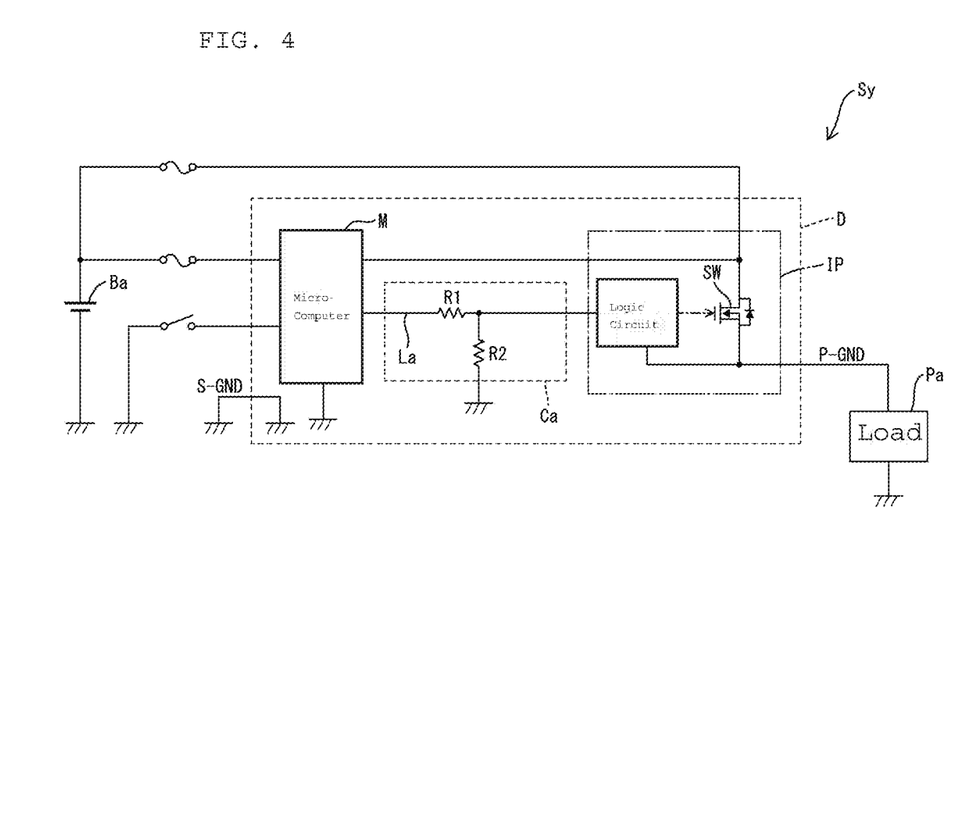
FIG. 4 is a circuit diagram schematically illustrating an on-board system that includes a load driving device that serves as a comparative example.
Figure 5:
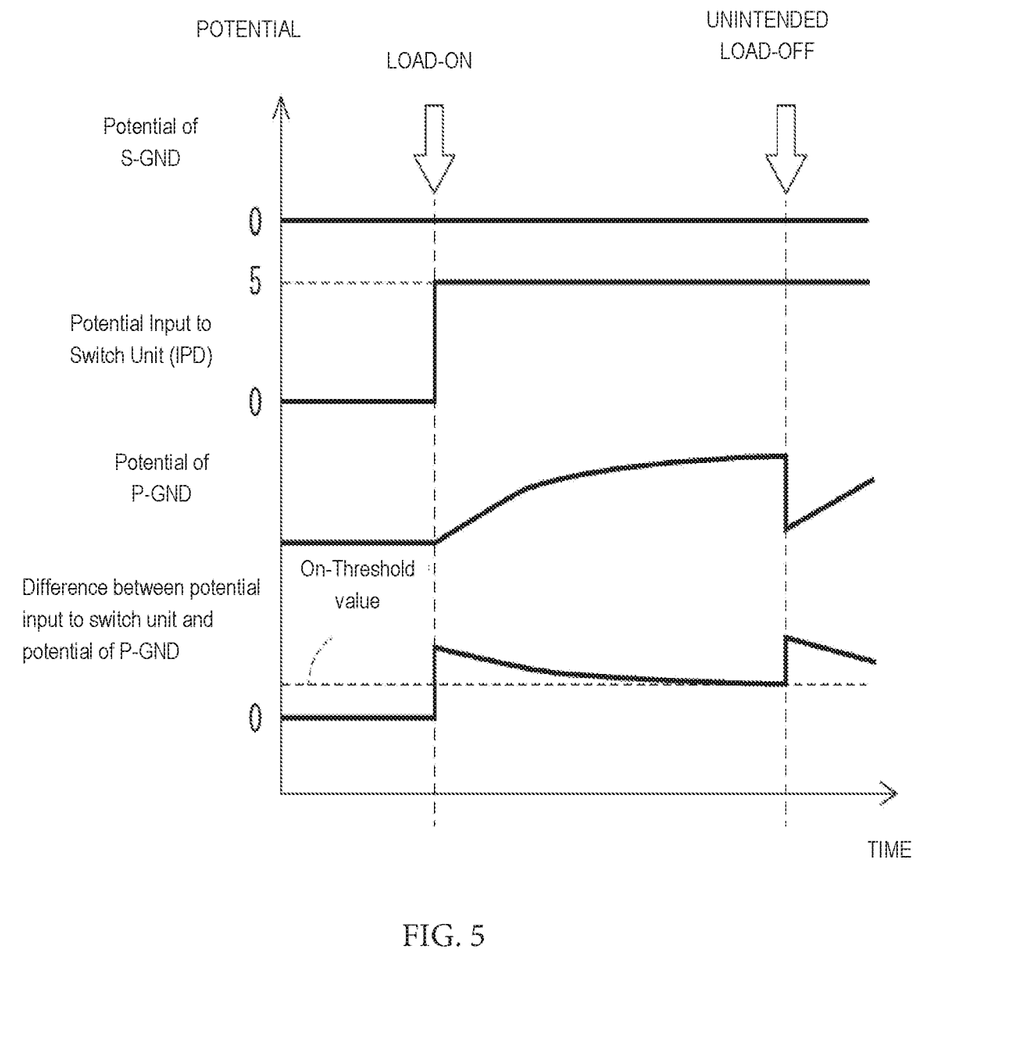
FIG. 5 is a timing chart showing changes in the potential of each part of the on-board system shown in FIG. 4.

FIG. 4 illustrates an on-board system Sy that includes a load driving device D that controls power supply from a power source unit Ba to a load Pa by switching a switch unit IP. FIG. 5 shows changes in the potential of each part of the load driving device D. In this load driving device D, when a load driving request signal is input to a microcomputer M in response to a switching operation of an external switch, the microcomputer M outputs a high level signal to a signal line La. The high level signal output from the microcomputer M is input to the switch unit IP as a signal having a predetermined potential, via a driving circuit Ca that is constituted by a resistor R1 and a resistor R2. A semiconductor switching element SW provided in the switch unit IP performs an ON operation when the potential of the signal (input potential) input to the switch unit IP via the driving circuit Ca is greater than the potential of a conducting path (P-GND) that is interposed between the semiconductor switching element SW and the load Pa, by a predetermined value or more. In the example shown in FIG. 5, the switch unit IP is performing the ON operation at "LOAD-ON" because the input potential to the switch unit IP and the potential of the conducting path (P-GND) is greater than an ON-threshold value.

In the on-board system Sy shown in FIG. 4, upon a current flowing from the power source unit Ba into the load Pa due to the ON operation of the switch unit IP (i.e. the ON operation of the semiconductor switching element SW), the potential of the conducting path (P-GND) interposed between the semiconductor switching element SW and the load Pa rises after, for example, "LOAD-ON" shown in FIG. 5. On the other hand, the output voltage that is applied from the microcomputer M to the signal line La (e.g. approximately 5 V) is lower than the output voltage from the power source unit Ba, and the reference of this output voltage is the ground potential of the microcomputer M (the potential of S-GND that is maintained at 0 V, independently of ON and OFF of the switch unit IP). Due to such a configuration, if the potential of the conducting path (P-GND) rises due to a current that is applied in response to the ON operation of the semiconductor switching element SW after, for example, "LOAD-ON" shown in FIG. 5, there is the risk of the difference between the input potential supplied from the driving circuit Ca to the switch unit IP and the potential of the conducting path (P-GND) becoming lower than a value (the ON-threshold value) that is required to cause the switch unit IP to perform the ON operation. If such a situation occurs, erroneous blocking occurs, which is a phenomenon in which, for example, the switch unit IP performs an OFF operation despite a driving signal being continuously output from the microcomputer M to the signal line La. In the example shown in FIG. 5, such erroneous blocking occurs at "UNINTENDED LOAD-OFF". After the erroneous blocking occurs, the difference between the input potential to the switch unit IP and the potential of the conducting path (P-GND) increases again, and therefore the switch unit IP performs the ON operation again. Consequently, such unintended ON and OFF operations are repeatedly performed.

SUMMARY

The present invention is made in light of the above-described situation, and aims to provide a load driving device in which an erroneous blocking operation is unlikely to occur in a switch unit even when a current is applied to a load in response to the switch unit performing an ON operation and a referential potential changes.

A load driving device according to the present invention includes:

a control unit configured to output a driving signal and a non-driving signal;

a first switch unit configured to switch a power path that is connected to a first input line and is located between a power supply unit and a load, to a conductive state and a non-conductive state, and bring the power path into a conductive state when a difference between a potential of the first input line and a potential of a conducting path on the load side in the power path is greater than a predetermined value; and a second switch unit configured to bring a path between a power supply path that is electrically connected to the power supply unit and the first input line, into a conductive state upon the control unit outputting the driving signal, and to block conduction between the power supply path and the first input line upon the control unit outputting the non-driving signal.

In the load driving device according to the present invention, the second switch unit brings the path between the power supply path and the first input line, into a conductive state upon the control unit outputting the driving signal. Therefore, at this time, the potential of the first input line can be set to be high based on the power supply voltage supplied from the power supply unit. Therefore, even if the potential of the conducting path on the load side rises after the first switch unit has performed the ON operation, a large difference between the potential of the first input line and the potential of the conducting path on the load side is secured.

Thus, it is possible to reliably prevent an erroneous blocking operation from being performed in the first switch unit.

DETAILED DESCRIPTION OF THE EMBODIMENTS

In the present invention, the second switch unit may include a first semiconductor element and a second semiconductor element. The first semiconductor element may be connected to the second input line and located between the power supply path and the first input line, and may be configured to bring the path between the power supply path and the first input line into a conductive state if a potential of the second input line relative to the power supply path is in a predetermined low potential state, and to block conduction between the power supply path and the first input line if the potential of the second input line relative to the power supply path is not in the predetermined low potential state. The second semiconductor element may be connected to a third input line and located between the second input line and a referential conducting path, and may be configured to bring a path between the second input line and the referential conducting path into a conductive state upon the driving signal being supplied to the third input line, and to block conduction between the second input line and the referential conducting path upon the non-driving signal being supplied to the third input line.

With this configuration, it is possible to cause the second semiconductor element to perform the ON operation upon the driving signal being output by the control unit, to bring the path between the second input line and the referential conducting path into a conductive state. The potential of the second input line drops upon the path between the second input line and the referential conducting path being brought into a conductive state, and thus it is possible to switch the potential of the second input line relative to the power supply path to the predetermined low potential state. With such an operation, it is possible to raise the potential of the first input line by bringing the path between the power supply path and the first input line into a conductive state, to bring the first switch unit into the ON state.

On the other hand, it is possible to cause the second semiconductor element to perform the OFF operation upon the non-driving signal being output by the control unit, to block conduction between the second input line and the referential conducting path. At this time, the potential of the second input line is relatively high, and thus switching to a state that is not "the predetermined low potential state" is performed. With such an operation, it is possible to lower the potential of the first input line by blocking conduction between the power supply path and the first input line, to bring the first switch unit into the OFF state.

A motor may be employed as the load that is to be driven.

If a motor is employed as the load to be driven in this way, there is the concern that the potential of the conducting path on the load side will rise upon the first switch unit being switched to a conductive state and a load current being supplied to the motor, which leads to the above-described problem (the problem of an erroneous blocking operation). In particular, concern regarding this problem increases if there are large fluctuations in the load current. The above-described configurations can effectively solve this problem.

The following describes a first embodiment of the present invention.

Figure 1:
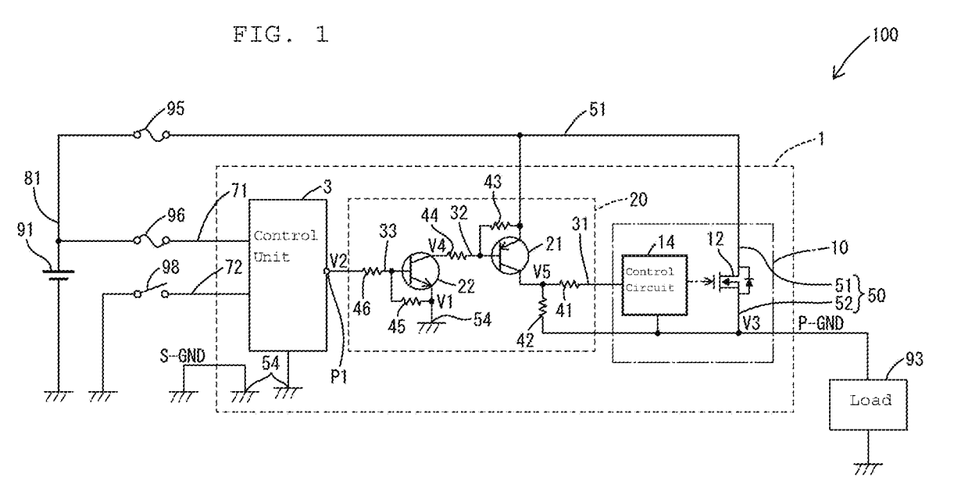
FIG. 1 is a circuit diagram schematically illustrating an on-board system that includes a load driving device according to a first embodiment.

An on-board system 100 shown in FIG. 1 is a load driving system that is to be mounted on a vehicle. This on-board system 100 includes a power supply unit 91, a load 93, a load driving device 1, and so on, and is configured as a system that controls power supply from the power supply unit 91 to the load 93 by using the load driving device 1.

The power supply unit 91 is constituted by a well-known on-board power storage unit such as a lead battery, and is configured to apply a predetermined power supply voltage (e.g. a voltage of 12 V) to a power supply path 51. Note that a charging current is supplied from a power generator (not shown) to the power supply unit 91, and thus the power supply unit 91 is charged.

A wiring unit 81 is connected to the power supply unit 91, and the power supply path 51 is electrically connected to the wiring unit 81 via a fuse 95. A power supply line 71 is connected to the wiring unit 81 via a fuse 96, and a power supply voltage that is output from the power supply unit 91 can also be supplied to a control unit 3.

The load 93 is configured as a well-known on-board load. Specifically, the load 93 can be various electrical components such as a motor and other actuators. For example, if a motor is employed as the load 93, various well-known motors such as a direct current motor, an alternating current motor, and a stepping motor can be provided. One end of the load 93 is connected to a conducting path 52, and the other end is connected to the ground. The load 93 is configured to operate by using a current that is supplied from the power supply unit 91 while a first switch unit 10, which will be described later, is performing an ON operation.

A switch 98 is used to provide the control unit 3 with an instruction to drive the load 93 and an instruction to stop driving the load 93, and, for example, a user performs ON and OFF operations on the switch 98. For example, a signal that indicates an instruction to drive (e.g. an L level signal) is supplied to a signal line 72 when a user is performing an ON operation on the switch 98, and a signal that indicates an instruction to stop driving (e.g. a H level signal) is supplied to the signal line 72 when the user is not performing the ON operation on the switch 98.

The load driving device 1 is configured as, for example, an on-board ECU, and is constituted by various electronic components that are mounted on a circuit board (not shown). The load driving device 1 includes the control unit 3, the first switch unit 10, a second switch unit 20, and so on.

The control unit 3 is configured as, for example, a microcomputer that includes a CPU, a ROM, a RAM, and so on. A third input line 33 that is a signal line is electrically connected to an output terminal P1 of the control unit 3, and the control unit 3 is configured to output a driving signal and a non-driving signal via the output terminal P1. In the example shown in FIG. 1, a potential that is applied to the output terminal P1 of the control unit 3 (an output potential) is denoted as V2.

A referential conducting path 54 is electrically connected to the control unit 3. In FIG. 1, the referential conducting path 54 is also denoted as S-GND. The referential conducting path 54 is maintained at a predetermined ground potential (0 V), and is also connected to an emitter of a second semiconductor element 22. The potential of the referential conducting path 54 (S-GND) is maintained to be stable without being affected by variations in the potential of the conducting path 52 (P-GND) on the load 93 side.

The first switch unit 10 is configured as an IPD (Intelligent Power Device) that includes a semiconductor switching element 12 and a control circuit 14, and is configured to switch a power path 50 that is located between the power supply unit 91 and the load 93, to a conductive state and a non-conductive state. The first switch unit 10 is connected to a first input line 31. The first switch unit 10 brings the power path 50 into a conductive state by performing an ON operation when the difference between the potential of the first input line 31 and the potential of the conducting path 52 on the load 93 side in the power path 50 is greater than a predetermined value, and brings the power path 50 into a non-conductive state by performing an OFF operation when the difference is not greater than the predetermined value. A load current is supplied from the power supply unit 91 to the load 93 only when the first switch unit 10 has performed the ON operation.

The second switch unit 20 has the function of bringing the path between the power supply path 51 and the first input line 31 into a conductive state if the control unit 3 outputs a driving signal, and the function of blocking conduction between the power supply path 51 and the first input line 31 if the control unit 3 outputs a non-driving signal. The power supply path 51 is an electrical path that is electrically connected to the power supply unit 91, and is a part that is located upstream of the first switch unit 10 on the power path 50.

The second switch unit 20 includes a first semiconductor element 21 that is configured as a PNP type bipolar transistor, and the second semiconductor element 22 that is configured as an NPN type bipolar transistor. The first semiconductor element 21 is connected to a second input line 32, and is located between the power supply path 51 and the first input line 31. Specifically, the second input line 32 is connected to the base of the first semiconductor element 21, the power supply path 51 is connected to the emitter of the first semiconductor element 21, and the first input line 31 is electrically connected to the collector of the first semiconductor element 21 via a resistor unit 41.

The emitter and the base of the first semiconductor element 21 are connected to each other via a resistor unit 43. One end of the resistor unit 43 is connected to the emitter of the first semiconductor element 21 and the power supply path 51, and the other end of the resistor unit 43 is connected to the base of the first semiconductor element 21. The resistor unit 41 is located between the collector of the first semiconductor element 21 and the first switch unit 10. One end of the resistor unit 41 is connected to the collector of the first semiconductor element 21, and the other end of the resistor unit 41 is connected to the control circuit 14 of the first switch unit 10. A resistor unit 42 is located between the collector of the first semiconductor element 21 and the conducting path 52 (P-GND). One end of the resistor unit 42 is connected to the collector of the first semiconductor element 21, and the other end of the resistor unit 42 is connected to the conducting path 52.

This first semiconductor element 21 functions to bring the path between the power supply path 51 and the first input line 31 into a conductive state if the potential of the second input line 32 relative to the power supply path 51 is in a predetermined low potential state, and to block conduction between the power supply path 51 and the first input line 31 if the potential of the second input line 32 relative to the power supply path 51 is not in a predetermined low potential state.

The second semiconductor element 22 is connected to the third input line 33, and is located between the second input line 32 and the referential conducting path 54. Specifically, the third input line 33 is connected to the base of the second semiconductor element 22, the second input line 32 is electrically connected to the collector of the second semiconductor element 22 via a resistor unit 44, and the referential conducting path 54 is connected to the emitter of the second semiconductor element 22.

The emitter and the base of the second semiconductor element 22 are connected to each other via a resistor unit 45. One end of the resistor unit 45 is connected to the emitter of the second semiconductor element 22 and the referential conducting path 54, and the other end of the resistor unit 45 is connected to the base of the first semiconductor element 21 and one end of a resistor unit 46. The resistor unit 44 is located between the collector of the second semiconductor element 22 and the base of the first semiconductor element 21, and one end of the resistor unit 44 is connected to the base of the first semiconductor element 21 and one end of the resistor unit 43, and the other end of the resistor unit 44 is connected to the collector of the second semiconductor element 22. The resistor unit 46 is provided between the base of the second semiconductor element 22 and the output terminal P1 of the control unit 3.

The second semiconductor element 22 functions to bring the path between the second input line 32 and the referential conducting path 54 into a conductive state if the driving signal from the control unit 3 is supplied to the third input line 33 via the resistor unit 46, and to block conduction between the second input line 32 and the referential conducting path 54 if a non-driving signal from the control unit 3 is supplied to the third input line 33 via the resistor unit 46.

Next, the operation of the load driving device 1 will be described with reference to FIG. 2 as well.

In the load driving device 1 shown in FIG. 1, the user operates the switch 98, and if the signal indicating an instruction to drive is supplied to the control unit 3, the control unit 3 switches the potential V2 of the output terminal P1 to a high level, and supplies the high level signal to the third input line 33. In the example shown in FIG. 2, such switching is performed at time T1, at which the output potential V2 of the control unit 3 is switched to a high level (e.g. 5 V).

Figure 2:
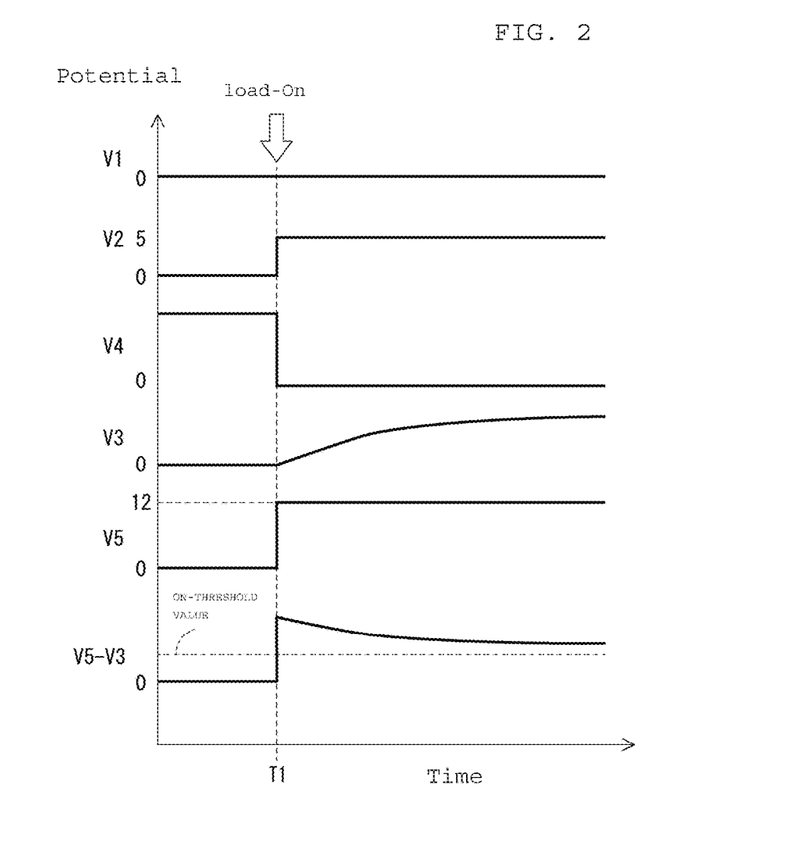
FIG. 2 is a timing chart showing changes in the potential of each part of the on-board system shown in FIG. 1.

Upon the high level signal being supplied to the third input line 33 at time T1 shown in FIG. 2, the second semiconductor element 22 performs an ON operation, and the path between the second input line 32 and the referential conducting path 54 is brought into a conductive state. Therefore, a collector potential V4 of the second semiconductor element 22 is switched to a low level that is close to 0 V. The potential of the second input line 32 (i.e. the base potential of the first semiconductor element 21) is switched to a low level in response to the switching of the collector potential V4, and therefore the first semiconductor element 21 performs the ON operation at time T1.

In this configuration, a state in which a certain degree of potential difference between the base and the emitter of the first semiconductor element 21 (i.e. the potential difference between the power supply path 51 and the second input line 32) is secured such that the first semiconductor element 21 can be caused to perform the ON operation is "the predetermined low potential state". Note that the second semiconductor element 22 is kept in the OFF state while the control unit 3 keeps the potential V2 of the output terminal at the low level and is outputting the non-driving signal (the low level signal) to the third input line 33. At this time, conduction between the second input line 32 and the referential conducting path 54 is blocked, and the potential of the second input line 32 approximately equals the potential of the power supply path 51. Thus, the second input line 32 is brought out of "the predetermined low potential state", and the first semiconductor element 21 is maintained in the OFF state.

As described above, the potential of the second input line 32 relative to the power supply path 51 is switched to "the predetermined low potential state" due to the driving signal being output from the control unit 3. Upon the first semiconductor element 21 performing the ON operation, the path between the power supply path 51 and the first input line 31 is brought into a conductive state, and a collector potential V5 of the first semiconductor element 21 becomes approximately the same as the potential of the power supply path 51 (12 V in the example shown in FIG. 2). In other words, the potential of the first input line 31, which is input to the control circuit 14 of the first switch unit 10, becomes a high potential that is approximately the same as the potential of the power supply path 51, and the difference between the potential V5 of the first input line 31 and the potential V3 of the conducting path 52 (P-GND) exceeds the ON-threshold value (the lower limit of the potential difference that is required to cause the semiconductor switching element 12 to perform the ON operation). Therefore, the semiconductor switching element 12 performs the ON operation. Upon the semiconductor switching element 12 performing the ON operation in this way, a load current is supplied to the load 93.

As described above, in the load driving device 1, the second switch unit 20 brings the path between the power supply path 51 and the first input line 31 into a conductive state upon the control unit 3 outputting the driving signal, and at this time, the potential of the first input line 31 can be set to be high based on the power supply voltage supplied from the power supply unit 91.

Therefore, even if the potential of the conducting path 52 (P-GND) on the load 93 side rises after the first switch unit 10 has performed the ON operation, a large difference between the potential V5 of the first input line 31 and the potential V3 of the conducting path 52 (P-GND) on the load 93 side is secured. Thus, it is possible to reliably prevent an erroneous blocking operation from being performed in the first switch unit 10.

In this configuration, the second switch unit 20 includes the first semiconductor element 21 and the second semiconductor element 22. The first semiconductor element 21 is connected to the second input line 32 and is located between the power supply path 51 and the first input line 31. The first semiconductor element 21 is configured to bring the path between the power supply path 51 and the first input line 31 into a conductive state if the potential of the second input line 32 relative to the power supply path 51 is in the predetermined low potential state, and to block conduction between the power supply path 51 and the first input line 31 if the potential of the second input line 32 relative to the power supply path 51 is not in the predetermined low potential state. The second semiconductor element 22 is connected to the third input line 33, and is located between the second input line 32 and the referential conducting path 54. The second semiconductor element 22 is configured to bring the path between the second input line 32 and the referential conducting path 54 into a conductive state upon the driving signal being supplied to the third input line 33, and to block conduction between the second input line 32 and the referential conducting path 54 upon a non-driving signal being supplied to the third input line 33.

With this configuration, it is possible to cause the second semiconductor element 22 to perform the ON operation upon the driving signal being output by the control unit 3, to bring the path between the second input line 32 and the referential conducting path 54 into a conductive state. The potential of the second input line 32 drops upon the path between the second input line 32 and the referential conducting path 54 being brought into a conductive state, and thus it is possible to switch the potential of the second input line 32 relative to the power supply path 51 to the predetermined low potential state. With such an operation, it is possible to raise the potential of the first input line 31 by bringing the path between the power supply path 51 and the first input line 31 into a conductive state, to bring the first switch unit 10 into the ON state.

On the other hand, it is possible to cause the second semiconductor element 22 to perform the OFF operation upon the non-driving signal being output by the control unit 3, to block conduction between the second input line 32 and the referential conducting path 54. At this time, the potential of the second input line 32 is relatively high, and thus switching to a state that is not "the predetermined low potential state" is performed. With such an operation, it is possible to lower the potential of the first input line 31 by blocking conduction between the power supply path 51 and the first input line 31, to bring the first switch unit 10 into the OFF state.

The present invention is not limited to the embodiments that have been illustrated based on the above descriptions and the drawings, and, for example, the following embodiments are included in the technical scope of the present invention.

(1) In the above-described embodiments, descriptions have been given of examples in which, as the basic functions of the first switch unit 10 configured as an IPD, the semiconductor switching element 12 performs the ON operation if the difference between the potential of the first input line 31 and the potential of the conducting path 52 (P-GND) on the load 93 side on the power path 50 is greater than the predetermined value, and the semiconductor switching element 12 performs the OFF operation if the difference is not greater than the predetermined value. However, in any of the examples, the first switch unit 10 may be provided with a well-known protection function in addition to the basic configuration. An example of the protection function is a function by which a current that flows through the power path 50 is monitored, and if an overcurrent is detected in the power path 50, the control circuit 14 causes the semiconductor switching element 12 to perform the OFF operation instead of carrying out the above-described basic function. Also, well-known protection functions other than this function may be provided.

(2) In the above-described embodiments, descriptions have been given of examples of a configuration in which an instruction to drive is provided while a predetermined operation is being performed by the user, and an instruction to stop driving is provided while the predetermined operation is not being performed. However, the present invention is not limited to such a configuration. In any of the examples, for example, an instruction to drive and an instruction to stop driving may be supplied to the control unit 3 from, for example, an electronic control device that is provided outside the load driving device 1.

(3) In the above-described embodiments, descriptions have been given of examples in which the first switch unit 10 is configured as an IPD. However, it is possible to omit the control circuit 14, and the first switch unit 10 may be configured as an N channel type MOSFET whose gate is connected to the first input line 31.

Figure 3:
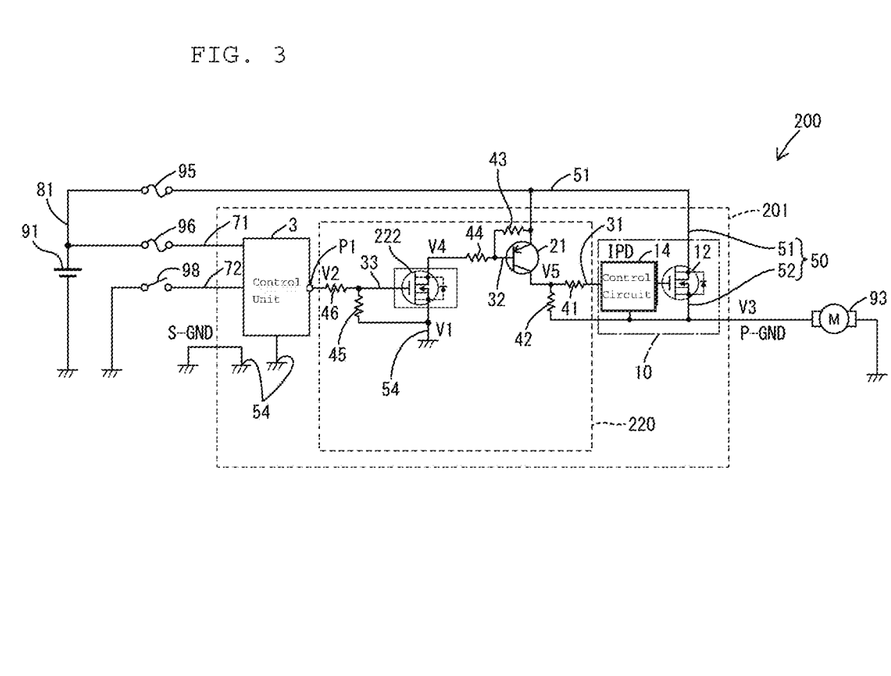
FIG. 3 is a circuit diagram schematically illustrating an on-board system that includes a load driving device according to a second embodiment.

(4) In the above-described embodiments, descriptions have been given of examples in which the first semiconductor element 21 and the second semiconductor element 22 are employed in the second switch unit 20. However, any configurations that can realize the above-described concept can be employed. For example, as in a load driving device 201 that is provided in an on-board system 200 that is shown in FIG. 3, a second semiconductor element 222 that is configured as a MOSFET may be employed. Note that the on-board system 200 shown in FIG. 3 is different from the on-board system 100 illustrated in the first embodiment only in that the second semiconductor element 222 is used instead of the second semiconductor element 22, and is otherwise the same as the on-board system 100. In FIG. 3, the third input line 33 is connected to the gate of the second semiconductor element 222, and the second input line 32 is connected to the drain of the second semiconductor element 222 via the resistor unit 44, and the referential conducting path 54 is connected to the source of the second semiconductor element 222. With this configuration, the second semiconductor element 222 performs the ON operation upon the driving signal being output from the control unit 3, and the second semiconductor element 222 performs the OFF operation upon the non-driving signal being output from the control unit 3. The other components and the functions are the same as those in the first embodiment.

What is claimed is:
1. A load driving device comprising:
    a control unit configured to output a driving signal and a non-driving signal;
    a second switch unit configured to bring a path between a power supply path that is electrically connected to a power supply unit and a first input line, into a conductive state upon the control unit outputting the driving signal, and to block conduction between the power supply path and the first input line upon the control unit outputting the non-driving signal; and
    a first switch unit connected to the first input line and configured to switch a power path located between a power supply unit and a load, to a conductive state and a nonconductive state, and bring the power path into a conductive state when a difference between a potential of the first input line and a potential of a conducting path on the load side in the power path is greater than a predetermined value.

2. The load driving device according to claim 1, wherein the second switch unit includes:
    a first semiconductor element that is connected to a second input line and is located between the power supply path and the first input line, and is configured to bring the path between the power supply path and the first input line into a conductive state if a potential of the second input line relative to the power supply path is in a predetermined low potential state, and to block conduction between the power supply path and the first input line if the potential of the second input line relative to the power supply path is not in the predetermined low potential state; and
    a second semiconductor element that is connected to a third input line and is located between the second input line and a referential conducting path, and is configured to bring a path between the second input line and the referential conducting path into a conductive state upon the driving signal being supplied to the third input line, and to block conduction between the second input line and the referential conducting path upon the non-driving signal being supplied to the third input line.

3. The load driving device according to claim 1, wherein the load is a motor.

4. The load driving device according to claim 2, wherein the load is a motor.

5. The load driving device according to claim 1, wherein the first switch unit includes a switching element and a control circuit.

* * * * *